United States Patent
Chou et al.

(10) Patent No.: US 10,103,239 B1
(45) Date of Patent: Oct. 16, 2018

(54) HIGH ELECTRON MOBILITY TRANSISTOR STRUCTURE

(71) Applicant: Vanguard International Semiconductor Corporation, Hsinchu (TW)

(72) Inventors: Yu-Chieh Chou, New Taipei (TW); Hsin-Chih Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/856,443

(22) Filed: Dec. 28, 2017

(51) Int. Cl.
*H01L 29/66* (2006.01)
*H01L 29/778* (2006.01)
(Continued)

(52) U.S. Cl.
CPC .... *H01L 29/66462* (2013.01); *H01L 29/2003* (2013.01); *H01L 29/205* (2013.01); *H01L 29/7786* (2013.01)

(58) Field of Classification Search
CPC ............. H01L 29/0619; H01L 29/0649; H01L 29/0653; H01L 29/1075; H01L 29/152;
(Continued)

(56) References Cited

U.S. PATENT DOCUMENTS 6,627,948 B1 * 9/2003 Fujihira ............. H01L 29/0619
257/328

7,999,288 B2 * 8/2011 Briere ................... H01L 29/045
257/194
(Continued)

FOREIGN PATENT DOCUMENTS

TW 201320333 A1 5/2013
TW 201709419 A 3/2017
(Continued)

OTHER PUBLICATIONS

Taiwanese Office Action and Search Report dated Jan. 4, 2018 for Application No. 106130276.
(Continued)

*Primary Examiner* — Mohammed Shamsuzzaman
(74) *Attorney, Agent, or Firm* — Birch, Stewart, Kolasch & Birch, LLP

(57) ABSTRACT

A high electron mobility transistor (HEMT) structure including a substrate, a barrier layer, a buffer layer, a source, a drain, a multi-gate structure, and a multi-field plate structure is provided. The barrier layer is disposed over the substrate. The buffer layer is disposed between the substrate and the barrier layer, and includes a channel region adjacent to an interface between the barrier layer and the buffer layer. The source and the drain are disposed on the barrier layer. The multi-gate structure is disposed between the source and the drain, and includes first conductive finger portions spaced apart from each other. The multi-field plate structure is disposed between the multi-gate structure and the drain, and includes second conductive finger portions spaced apart from each other. The first conductive finger portions and the second conductive finger portions are in an alternate and parallel arrangement.

15 Claims, 4 Drawing Sheets

(51) Int. Cl.
*H01L 29/205* (2006.01)
*H01L 29/20* (2006.01)

(58) Field of Classification Search
CPC . H01L 29/2003; H01L 29/205; H01L 29/402; H01L 29/404; H01L 29/41758; H01L 29/4236; H01L 29/42376; H01L 29/47; H01L 29/51; H01L 29/66143; H01L 29/66212; H01L 29/66462; H01L 29/7783; H01L 29/7786; H01L 29/7787; H01L 29/812; H01L 29/872
USPC ............................ 257/194, 192, 76, 77, 140
See application file for complete search history.

(56) References Cited

U.S. PATENT DOCUMENTS

| | | | | |
|---|---|---|---|---|
| 8,716,141 B2* | 5/2014 | Dora | ................... | H01L 29/1608 438/640 |
| 9,349,805 B2* | 5/2016 | Ito | ....................... | H01L 29/2003 |
| 9,525,052 B2* | 12/2016 | Briere | ................... | H01L 29/402 |
| 9,871,119 B2* | 1/2018 | Wood | ................ | H01L 29/66704 |
| 2010/0230717 A1* | 9/2010 | Saito | ................... | H01L 29/0692 257/140 |
| 2011/0221011 A1* | 9/2011 | Bahat-Treidel | ....... | H01L 29/404 257/409 |
| 2012/0012858 A1* | 1/2012 | Inoue | ................... | H01L 21/765 257/76 |
| 2012/0074577 A1 | 3/2012 | Nakanishi et al. | | |
| 2012/0126287 A1* | 5/2012 | Aoki | ..................... | H01L 29/402 257/192 |
| 2014/0264379 A1* | 9/2014 | Kub | ................. | H01L 29/41725 257/77 |
| 2014/0264431 A1* | 9/2014 | Lal | ..................... | H01L 27/0883 257/121 |
| 2015/0034972 A1* | 2/2015 | Kuraguchi | ............ | H01L 29/267 257/77 |
| 2016/0218189 A1 | 7/2016 | Oasa | | |
| 2016/0225889 A1* | 8/2016 | Umeno | ................... | H01L 29/47 |
| 2016/0293596 A1* | 10/2016 | Fareed | ................ | H01L 27/0883 |
| 2017/0162684 A1* | 6/2017 | Lal | ..................... | H01L 29/7787 |

FOREIGN PATENT DOCUMENTS

| | | |
|---|---|---|
| TW | 201709512 A | 3/2017 |
| TW | 201714307 A | 4/2017 |
| TW | 201724269 A | 7/2017 |

OTHER PUBLICATIONS

Taiwanese Office Action and Search Report for Taiwanese Application No. 106130276, dated Jul. 17, 2018.

* cited by examiner

HIGH ELECTRON MOBILITY TRANSISTOR STRUCTURE

BACKGROUND

Field of the Disclosure

The present disclosure relates to semiconductor technology, and in particular, it relates to a high electron mobility transistor (HEMT) structure that is capable of modulating the threshold voltage thereof.

Description of the Related Art

In the semiconductor industry, high-voltage switching transistors such as HEMTs, junction field effect transistors (JFETs), or power MOSFETs are often used as semiconductor switches for high-voltage and high-power devices such as switched-mode power supplies (SMPSs). In such a high-voltage and high-power device, the HEMT can be operated at a high voltage without being damaged because it is advantageous in that it possesses high power densities, high breakdown voltage and high output voltage.

The HEMT typically includes depletion mode HEMT (D-mode HEMT) and enhancement mode HEMT (E-mode HEMT). In the D-mode HEMT, an electric field generated from the gate electrode is used to deplete a two-dimensional electron gas (2DEG) channel at the interface of a wide and narrow energy bandgap semiconductor. For E-mode HEMT, no channel is present and no current flow occurs until the transistor is biased for operation. Namely, the D-mode HEMT allows current to flow when no gate-source voltage is applied (also called a normally-on transistor). The E-mode HEMT blocks the flow of current when no gate-source voltage is applied (also called a normally-off transistor).

Although existing D-mode HEMTs and E-mode HEMTs have generally been adequate for their intended purposes, they have not been entirely satisfactory in all respects. For example, the HEMT structure is limited to have a single threshold voltage, and thus the application flexibility is reduced. Moreover, a high resistance semiconductor material is typically below the gate, so that it is easy to cause switching error and condition loss.

Therefore, there is a need to develop an HEMT structure that is capable of addressing or mitigating the problems described above.

SUMMARY

In some embodiments of the disclosure, a high electron mobility transistor (HEMT) structure is provided. The HEMT structure includes a substrate. The HEMT structure also includes a barrier layer disposed over the substrate. The HEMT structure also includes a buffer layer disposed between the substrate and the barrier layer and having a channel region adjacent to an interface between the barrier layer and the buffer layer. The HEMT structure also includes a source and a drain disposed over the barrier layer. The HEMT structure also includes a multi-gate structure disposed between the source and the drain and comprising a plurality of first conductive finger portions separated from each other. The HEMT structure also includes a multi-field plate structure disposed between the multi-gate structure and the drain and comprising a plurality of second conductive finger portions separated from each other, wherein the plurality of first conductive finger portions and the plurality of second conductive finger portions are in an alternate and parallel arrangement.

In some embodiments of the disclosure, a high electron mobility transistor (HEMT) structure is provided. The HEMT structure includes a substrate. The HEMT structure also includes a barrier layer disposed over the substrate. The HEMT structure also includes a buffer layer disposed between the substrate and the barrier layer and having a channel region adjacent to an interface between the barrier layer and the buffer layer. The HEMT structure also includes a source and a drain disposed over the barrier layer. The HEMT structure also includes a multi-gate structure disposed between the source and the drain and comprising a plurality of first conductive finger portions separated from each other. The HEMT structure also includes an electrical connection structure electrically connected to at least two of the plurality of first conductive finger portions, wherein at least one of the plurality of first conductive finger portions that is not electrically connected to the electrical connection structure.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
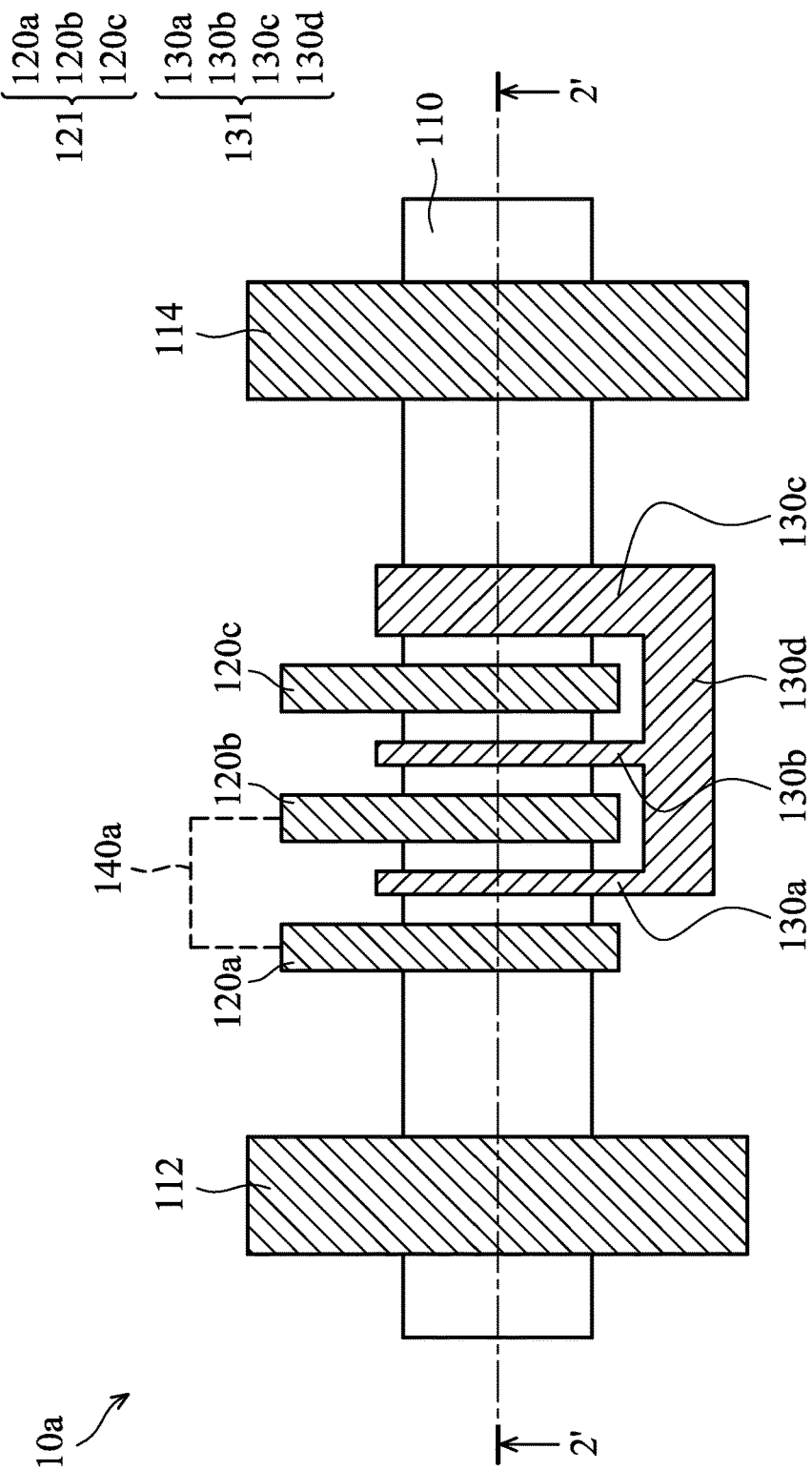
FIG. 1 is a plan view of an HEMT structure in accordance with some embodiments.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Embodiments of the present disclosure provide a metal-oxide-semiconductor (MOS) transistor structure, such as a high electron mobility transistor (HEMT) structure. The HEMT structure utilizes multiple gates to modulate the threshold voltage of the transistor, thereby increasing the application flexibility of the transistor. Moreover, compared to the HEMT structure with a single gate, the HEMT structure with multiple gates may reduce the channel length of the transistor, so as to reduce the parasitic resistance in the material below the gate, thereby preventing switching error and reducing condition loss.

Figure 2:
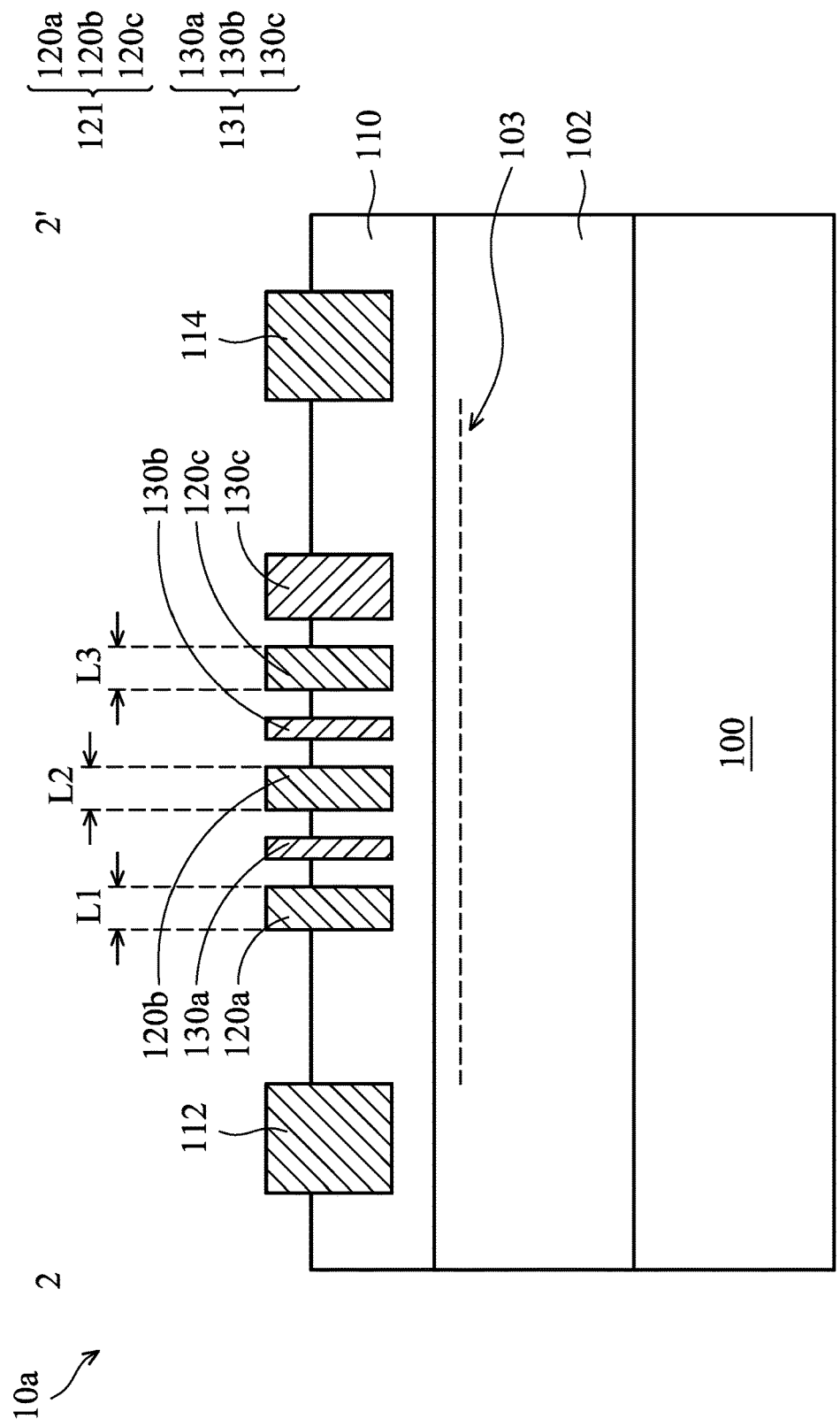
FIG. 2 is a cross-sectional view along line 2-2' of FIG. 1 showing an HEMT structure in accordance with some embodiments.

Refer to FIGS. 1 and 2, in which FIG. 1 illustrates a plan view of an HEMT structure 10a in accordance with some embodiments and FIG. 2 illustrates a cross-sectional view along line 2-2' of FIG. 1 showing an HEMT structure in accordance with some embodiments. As shown in FIG. 2, the HEMT structure 10a includes a substrate 100, a buffer layer 102, a barrier layer 110, a source 112, a drain 114, a multi-gate structure 121, and an optional multi-field plate structure 131, in accordance with some embodiments.

In some embodiments, the barrier layer 110 is disposed over the substrate 100, and the buffer layer 102 is disposed between the substrate 100 and the barrier layer 110. Moreover, the source 112 and the drain 114 are disposed on the barrier layer 110. Each of features in the HEMT structure 10a is described in detail in the following disclosure.

The HEMT structure 10a includes a substrate 10, as shown in FIG. 1 or 2 in accordance with some embodiments. In some embodiments, the substrate 100 comprises a silicon substrate, a silicon carbide substrate or a sapphire substrate. In some other embodiments, the substrate 100 also comprises a silicon-on-insulator (SOI) substrate.

In some embodiments, the HEMT structure 10a further includes a buffer layer 102 disposed over the substrate 100. The buffer layer 102 may be a multi-layer structure. For example, the buffer layer 102 includes a nucleation layer (not shown) and an overlying III-V group compound semiconductor layer (not shown). In some embodiments, the nucleation layer includes AlN, GaN, or AlGaN and is employed to reduce the stress caused by lattice mismatch between the substrate 100 and the III-V group compound semiconductor layer over the nucleation layer. For example, the lattice mismatch and the coefficient of thermal expansion (CTE) difference between the AlN-based nucleation layer and the substrate 100 are small, so that the stress between the substrate 100 and the subsequently formed III-V group compound semiconductor layer may be mitigated.

In some embodiments, the III-V group compound semiconductor layer over the nucleation layer may serve as a channel layer of the HEMT structure 10a. For example, the buffer layer 102 includes a channel region 103 (as indicated by a dashed line in FIG. 2), such as a two-dimensional electron gas (2DEG) channel, adjacent to the top surface of the buffer layer 102 (i.e., adjacent to an interface between the buffer layer 102 and the subsequently formed barrier layer). In some embodiments, the III-V group compound semiconductor layer over the nucleation layer includes InAlGaN, AlGaN, InGaN, GaN, AlN, or a combination thereof.

In some embodiments, the buffer layer 102 is formed over the substrate 100 by a deposition process, such as molecular beam epitaxy (MBE), metal organic chemical vapor deposition (MOCVD), hydride vapor phase epitaxy (HVPE), or another suitable deposition. In some embodiments, the buffer layer 102 has a thickness that is in a range from about 0.2 μm to 10 μm.

In some embodiments, the HEMT structure 10a further includes a barrier layer 110 disposed over and in direct contact with the buffer layer 102. In some embodiments, the barrier layer 110 includes III-V group compound semiconductor material, such as InAlGaN, AlGaN, InGaN, GaN, or a combination thereof. It should be noted that the barrier layer 110 is made of an III-V group compound semiconductor material that is different from the III-V group compound semiconductor layer in the buffer layer 102. For example, the barrier layer 110 is made of AlGaN and the III-V group compound semiconductor layer in the buffer layer 102 is made of GaN, so that a heterostructure is formed by the barrier layer 110 and the buffer layer 102.

In some embodiments, the barrier layer 110 is formed over the buffer layer 102 by MBE, MOCVD, HYPE, or another suitable deposition. In some embodiments, the barrier layer 110 has a thickness that is in a range from about 1 nm to 100 nm.

The band gap discontinuity between the buffer layer 102 and the barrier layer 110 forms a carrier channel with high electron mobility (indicated by the channel region 103) that is referred to as 2DEG channel. The transistor can be turned-on or off when the gate-source voltage is applied.

In some embodiments, the HEMT structure 10a further includes a source 112, a drain 114, and a multi-gate structure 121 disposed over and in direct contact with barrier layer 110. The multi-gate structure 121 is disposed between the source 112 and the drain 114. In some embodiments, the source 112, the drain 114, and the multi-gate structure 121 respectively and partially extend into the barrier layer 110, as shown in FIG. 2. As a result, the recessed multi-gate structure 121 may change the thickness of the barrier layer 110, so as to reduce 2DEG density. In some embodiments, the multi-gate structure 121, the source 112, and the drain 114 are disposed over the barrier layer 110 with a substantially flat surface and do not recess into the barrier layer 110.

The multi-gate structure 121 includes two or more than two first conductive finger portions that are spaced apart from and parallel to each other by a distance. In order to simplify the diagram, only three first conductive finger portions 120a, 120b, and 120c are depicted. It should be understood that the number of first conductive finger portions of the multi-gate structure 121 is based on the design demands and is not limited to the embodiment shown in FIGS. 1 and 2.

In some embodiments, the first conductive finger portion 120a has a width L1, the first conductive finger portion 120b has a width L2, and the first conductive finger portion 120c has a width L3. Those widths L1, L2, and L3 define the corresponding channel lengths, respectively. In some embodiments, the widths L1, L2, and L3 are different from each other, so that the corresponding channel lengths are different from each other. As a result, different threshold voltages may be obtained when the same voltages are respectively applied to the first conductive finger portions 120a, 120b, and 120c.

Moreover, compared to the conventional HEMT with a single gate, the sum of the widths L1, L2, and L3 may be less than or equal to the width of the single gate. Since the widths L1, L2, and L3 of the first conductive finger portions 120a, 120b, and 120c are respectively less than the width of the single gate mentioned above, the parasitic resistance in the material below the gate of the HEMT structure 10a is less than that of the material below the gate of the conventional HEMT. As a result, switching error can be prevented and condition loss can be reduced.

In some embodiments, the widths L1, L2, and L3 are equal to each other, so that the corresponding channel lengths are equal to each other. As a result, the same threshold voltages may be obtained when the same voltages are respectively applied to the first conductive finger portions 120a, 120b, and 120c. In some other embodiments, the widths L1, L2, and L3 are adjusted, so that two of the corresponding channel lengths are equal to each other. As a result, two different threshold voltages may be obtained when the same voltages are respectively applied to the first conductive finger portions 120a, 120b, and 120c.

In some embodiments, the multi-gate structure 121 includes a conductive material, such as metal (e.g., Ti, Ni, Au, or an alloy thereof). Moreover, the source 112 and the drain 114 respectively include a conductive material, such as metal (e.g., Ti, Ni, Au, or an alloy thereof). The multi-gate structure 121, the source 112, and the drain 114 may be formed by CVD, physical vapor deposition (PVD), atomic layer deposition (ALD), sputtering, or another suitable deposition.

In some embodiments, the HEMT structure 10a further includes electrical connection structure 140a that is electrically connected to at least two of the first conductive finger portions, so that at least one of the first conductive finger portions 120a, 120b, and 120c is not electrically connected to the electrical connection structure 140a. For example, the electrical connection structure 140a is electrically connected to the first conductive finger portions 120a and 120b, as shown in FIG. 1. In some embodiments, the electrical connection structure 140a is electrically connected to the first conductive finger portions 120a and 120c. In some other embodiments, the electrical connection structure 140a is electrically connected to the first conductive finger portions 120b and 120c.

In some embodiments, the electrical connection structure 140a includes an interconnect structure formed of a conductive plug(s) and a conductive layer(s). In some embodiments, the electrical connection structure 140a includes the wire(s). As a result, the HEMT structure 10a may have a function of modulating threshold voltage by adjusting the number of first conductive finger portions and the widths thereof, and/or controlling the connection manner of the electrical connection structure 140a, so that the HEMT structure 10a has the desired threshold voltage for various product applications.

In some embodiments, the HEMT structure 10a further includes a multi-field plate structure 131. The multi-field plate structure 131 is disposed between the multi-gate structure 121 and the drain 114. In some embodiments, the multi-field plate structure 131 is disposed over the barrier layer 110 and does not recess into the barrier layer 110.

In some embodiments, the multi-field plate structure 131 includes two or more than two second conductive finger portions that are spaced apart from and parallel to each other by a distance, as shown in FIGS. 1 and 2. In order to simplify the diagram, only three second conductive finger portions 130a, 130b, and 130c are depicted. In some embodiments, the first conductive finger portions 120a, 120b, and 120c and the second conductive finger portions 130a, 130b, and 130c are alternately arranged. It should be understood that the number of second conductive finger portions of the multi-field plate structure 131 is based on the design demands and is not limited to the embodiment shown in FIGS. 1 and 2.

In some embodiments, the multi-field plate structure 131 further includes a connection portion 130d that connects an end of the second conductive finger portions 130a, 130b, and 130c, respectively, as shown in FIG. 1. In some embodiments, the multi-field plate structure 131 includes a conductive material, such as metal (e.g., Ti, Ni, Au, or an alloy thereof). Moreover, the multi-field plate structure 131 may be formed by CVD, PVD, ALD, sputtering, or another suitable deposition. The multi-field plate structure 131 may mitigate the peak electric field below the multi-gate structure 121, thereby increasing the breakdown voltage of the transistor and reducing the leakage of the transistor.

Figure 3:
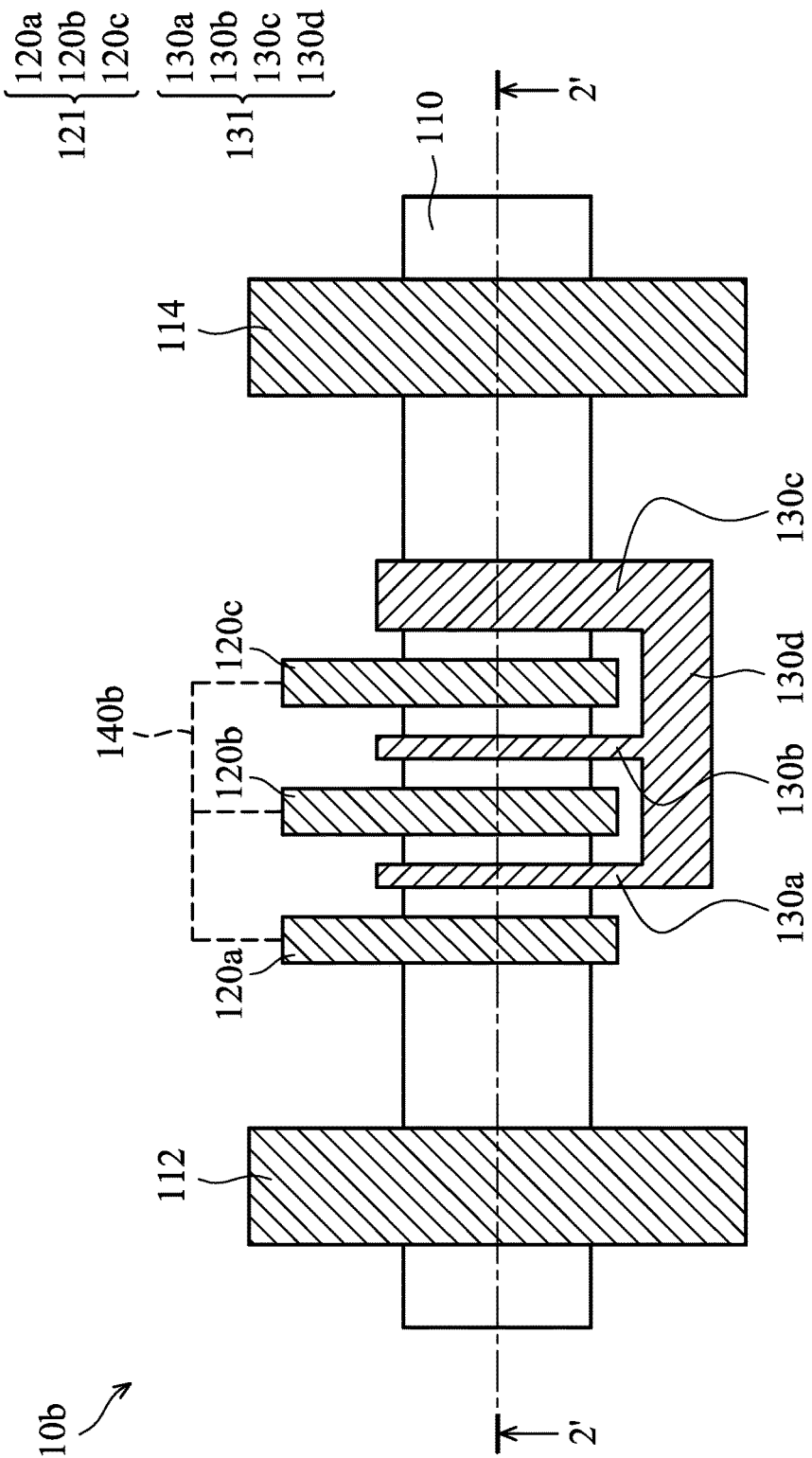
FIG. 3 is a plan view of an HEMT structure in accordance with some embodiments.

Refer to FIG. 3, which is a plan view of an HEMT structure 10b in accordance with some embodiments. Elements of the embodiments hereinafter that are the same or similar as those previously described with reference to FIG. 1, are not repeated for brevity. As shown in FIG. 3, the HEMT structure 10b is similar to the HEMT structure 10a shown in FIG. 1. Unlike the HEMT structure 10a, the HEMT structure 10b includes an electrical connection structure 140b that is electrically connected to an end of the first conductive finger portions 120a, 120b, and 120c, respectively. In some embodiments, the electrical connection structure 140b includes one or more fuse devices and an interconnect structure formed of one or more conductive plugs and one or more conductive layers. In some embodiments, the electrical connection structure 140b includes one or more fuse devices and one or more wires. As a result, the HEMT structure 10b may perform the function of modulating the threshold voltage by controlling the manner of connection of the electrical connection structure 140b via the fuse devices and/or adjusting the number of first conductive finger portions and the widths thereof, so that the HEMT structure 10b has the desired threshold voltage for various product applications.

Figure 4:
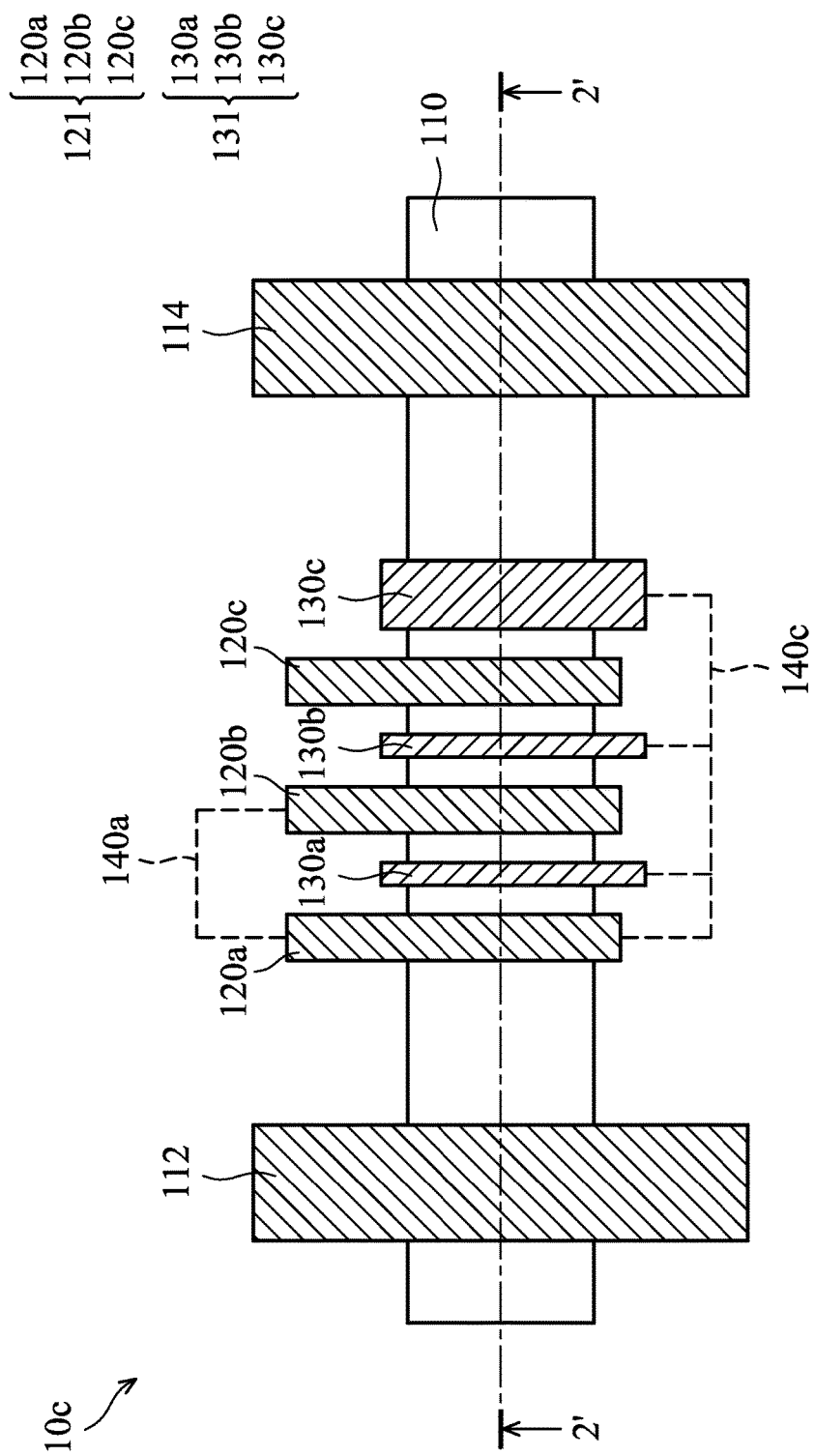
FIG. 4 is a plan view of an HEMT structure in accordance with some embodiments.

Refer to FIG. 4, which is a plan view of an HEMT structure 10c in accordance with some embodiments. Elements of the embodiments hereinafter that are the same or similar as those previously described with reference to FIG. 1, are not repeated for brevity. As shown in FIG. 4, the HEMT structure 10c is similar to the HEMT structure 10a shown in FIG. 1. Unlike the HEMT structure 10a, the HEMT structure 10c includes an electrical connection structure 140c that is electrically connected to an end of the second conductive finger portions 130a, 130b, and 130c, respectively. In some embodiments, the electrical connection structure 140c is selectively and electrically connected to at least one of the first conductive finger portions 120a, 120b, and 120c (e.g., the first conductive finger portion 120a). In some embodiments, the electrical connection structure 140c includes an interconnect structure formed of one or more conductive plugs and one or more conductive layers. In some embodiments, the electrical connection structure 140c includes one or more wires. It should be understood that the HEMT structure 10c may have electrical connection structure 140b as shown in FIG. 3, in place of electrical connection structure 140a.

According to the foregoing embodiments, since the HEMT structure has a multi-gate structure, the threshold voltage of the transistor can be modulated by adjusting the number of first conductive finger portions and/or the width thereof. Moreover, according to the foregoing embodiments, since the HEMT structure has one or more electrical connection structures that are electrically connected to the first conductive finger portions, the threshold voltage of the transistor can be further modulated by controlling the manner of connection of the electrical connection structures. As a result, the application flexibility of the transistor can be increased.

Moreover, compared to the HEMT structure with a single gate, the channel length of each gates of the HEMT structure with the multi-gate structure in accordance with foregoing embodiments is shorter, and thus the parasitic resistance in the material below the gate can be reduced (i.e., the turn-on resistance can be reduced). As a result, switching error can be prevented, condition loss can be reduced, and power-conversion efficiency can be increased.

In addition, according to the foregoing embodiments, since the conductive finger portions of the multi-field plate structure and those of the multi-gate structure are in an alternate arrangement in the HEMT structure, the peak electric field below the multi-gate structure can be mitigated, thereby increasing the breakdown voltage of the transistor and reducing the leakage thereof.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high electron mobility transistor (HEMT) structure, comprising:
   a substrate;
   a barrier layer disposed over the substrate;
   a buffer layer disposed between the substrate and the barrier layer and having a channel region adjacent to an interface between the barrier layer and the buffer layer;
   a source and a drain disposed over the barrier layer;
   a multi-gate structure disposed between the source and the drain and comprising a plurality of first conductive finger portions separated from each other; and
   a multi-field plate structure disposed between the multi-gate structure and the drain and comprising a plurality of second conductive finger portions separated from each other, wherein the plurality of first conductive finger portions and the plurality of second conductive finger portions are in an alternate and parallel arrangement;
   wherein the multi-field plate structure further comprises a connection portion that connects an end of the plurality of second conductive finger portions, respectively.

2. The HEMT structure as claimed in claim 1, wherein the plurality of first conductive finger portions has a respective width to define a corresponding channel length and wherein all the channel lengths are different from each other.

3. The HEMT structure as claimed in claim 1, wherein the plurality of first conductive finger portions has a respective width to define a corresponding channel length and wherein all the channel lengths are the same as each other.

4. The HEMT structure as claimed in claim 1, wherein the plurality of first conductive finger portions has a respective width to define a corresponding channel length and wherein some of the channel lengths are the same as each other.

5. The HEMT structure as claimed in claim 1, wherein a portion of the multi-gate structure extends into the barrier layer.

6. The HEMT structure as claimed in claim 1, wherein the multi-gate structure is in direct contact with the barrier layer.

7. The HEMT structure as claimed in claim 1, wherein the substrate comprises a silicon substrate, a silicon carbide substrate, or a sapphire substrate.

8. The HEMT structure as claimed in claim 1, wherein the barrier layer comprises InAlGaN, AlGaN, InGaN, GaN, or a combination thereof.

9. The HEMT structure as claimed in claim 1, wherein the barrier layer comprises InAlGaN, AlGaN, InGaN, GaN, AlN, or a combination thereof.

10. The HEMT structure as claimed in claim 1, wherein the source and the drain comprises Ti, Al, Ni, Mo, Au, or an alloy thereof.

11. The HEMT structure as claimed in claim 1, wherein the multi-gate structure or the multi-field plate structure comprises Ti, Ni, Au, or an alloy thereof.

12. A high electron mobility transistor (HEMT) structure, comprising:
    a substrate;
    a barrier layer disposed over the substrate; a buffer layer disposed between the substrate and the barrier layer and having a channel region adjacent to an interface between the barrier layer and the buffer layer;
    a source and a drain disposed over the barrier layer;
    a multi-gate structure disposed between the source and the drain and comprising a plurality of first conductive finger portions over the barrier layer and separated from and parallel to each other;
    an electrical connection structure electrically connected to at least two of the plurality of first conductive finger portions, wherein at least one of the plurality of first conductive finger portions is not electrically connected to the electrical connection structure;
    a multifield plate disposed over the barrier layer between the multi-gate structure and the drain, comprising:
    a plurality of second conductive finger portions, wherein the plurality of first conductive finger portions and the plurality of second conductive finger portions are in an alternate arrangement; and
    a connection portion connected to an end of the plurality of second conductive finger portions, respectively.

13. The HEMT structure as claimed in claim 12, wherein the plurality of first conductive finger portions has a respective width to define a corresponding channel length and wherein all the channel lengths are different from each other.

14. The HEMT structure as claimed in claim 12, wherein the plurality of first conductive finger portions has a respective width to define a corresponding channel length and wherein all the channel lengths are the same as each other.

15. The HEMT structure as claimed in claim 1, wherein a portion of the multi-gate structure extends into the barrier layer.

* * * * *